United States Patent
Moon et al.

(10) Patent No.: US 6,366,155 B1
(45) Date of Patent: Apr. 2, 2002

(54) REFERENCE VOLTAGE GENERATORS AND METHODS INCLUDING SUPPLEMENTARY CURRENT GENERATION, AND INTEGRATED CIRCUITS INCLUDING THE SAME

(75) Inventors: Byung-sick Moon; Mi-seon Kang, both of Seoul; Ho-sung Song, Kyungki-do, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/613,367

(22) Filed: Jul. 10, 2000

(30) Foreign Application Priority Data

Jul. 13, 1999 (KR) .......................... 99-28207

(51) Int. Cl.[7] .............................. G05F 1/10
(52) U.S. Cl. ...................... 327/530; 327/538
(58) Field of Search ............... 365/226; 326/87, 326/85, 91; 327/530, 403, 404, 409, 408, 538, 540

(56) References Cited

U.S. PATENT DOCUMENTS

| 5,473,575 A | 12/1995 | Farmwald et al. ...... 365/230.06 |
| 5,578,940 A | 11/1996 | Dillon et al. .................. 326/30 |
| 5,606,717 A | 2/1997 | Farmwald et al. .......... 395/856 |
| 5,663,661 A | 9/1997 | Dillon et al. ................. 326/30 |
| 5,850,159 A | * 12/1998 | Chow et al. .................. 326/87 |
| 6,051,995 A | * 4/2000 | Pollachek ..................... 326/87 |
| 6,072,742 A | * 6/2000 | Ooishi ........................ 365/226 |
| 6,072,747 A | 6/2000 | Yoon ..................... 365/230.06 |

FOREIGN PATENT DOCUMENTS

JP 61-255600 11/1986

* cited by examiner

*Primary Examiner*—Jung Ho Kim
(74) *Attorney, Agent, or Firm*—Myers Bigel Sibley & Sajovec

(57) ABSTRACT

Reference voltage regulators and methods for integrated circuit output driver systems generate an initial supplementary current for the integrated circuit output driver system at the reference voltage for a predetermined time period in response to an output enable signal. Preferably, sufficient initial supplementary current is generated to compensate for an initial drop in the reference voltage that is generated by a reference voltage generator upon initial activation of the output driver system. Reference voltage generators according to embodiments of the invention may be included in an integrated circuit output driver system that is responsive to a reference voltage and to an output enable signal, and that varies in current drive capability in response to a current drive control signal. These embodiments of reference voltage regulators include a reference voltage generator that generates the reference voltage for the integrated circuit output driver system. A supplementary current generator generates an initial supplementary current for the integrated circuit output driver system at the reference voltage for a predetermined time period in response to the output enable signal. In some embodiments, the supplementary current generator generates a fixed initial supplementary current for the integrated circuit output driver system. In other embodiments, the supplementary current generator generates a variable initial supplementary current for the integrated circuit output driver system at the reference voltage for the predetermined time period in response to the output enable signal, and that varies in response to the current drive control signal.

40 Claims, 6 Drawing Sheets

REFERENCE VOLTAGE GENERATORS AND METHODS INCLUDING SUPPLEMENTARY CURRENT GENERATION, AND INTEGRATED CIRCUITS INCLUDING THE SAME

FIELD OF THE INVENTION

This invention relates to integrated circuit devices and operating methods, and more particularly to reference voltage generators and voltage generation methods for integrated circuits.

BACKGROUND OF THE INVENTION

Integrated circuit devices are widely used in consumer and commercial applications. In particular, integrated circuit memory devices continue to increase in integration density and speed, while allowing reduced power consumption. For example, synchronous Dynamic Random Access Memories (DRAMs) that can operate in synchronization with system clocks have been developed to allow high speed operation. Dual data rate (DDR) synchronous DRAMs also have been developed to allow high performance memory devices.

Electronic systems such as data processing systems, often use buses including a plurality of signal lines, to interconnect integrated circuit devices, so that the integrated circuit devices can communicate with one another. Output drivers are generally included in microprocessor, logic and/or memory integrated circuits in order to drive signals that are internally generated in the integrated circuit onto the bus. These output drivers are generally driven by voltage level signals.

Recently, however, in order to achieve high speed operations and/or other advantages, integrated circuit devices that include current mode output drivers have been provided. The use of current mode output drivers can reduce the peak switching current and signal reflections on the bus, to thereby allow low power, high performance communications between integrated circuits.

One technology that uses current mode output drivers is the Rambus technology that is marketed by Rambus, Inc., Mountain View, Calif. The Rambus technology is described in U.S. Pat. No. 5,473,575 to Farmwald et al., U.S. Pat. No. 5,578,940 to Dillon et al., U.S. Pat. No. 5,606,717 to Farmwald et al. and U.S. Pat. No. 5,663,661 to Dillon et al. Also see U.S. Pat. No. 6,072,747 to Yoon that is assigned to the assignee of the present invention. Integrated circuit devices that include current mode output drivers will also be referred to herein as Rambus devices.

Rambus devices may operate at high data rate, for example at data rates at up to 800 MHz or more. In order to operate at these high data rates, it may be desirable to control the output drivers of Rambus DRAMs. Moreover, large amounts of data may be simultaneously read from memory cell arrays in Rambus DRAMs, so that large amounts of power may be consumed. In order to reduce the power consumption, it is known to provide output drivers for Rambus DRAMs that have a current drive capability which varies according to the loads on the output drivers, for example on the output pads thereof. Other integrated circuit devices including logic and/or memory devices also may have output drivers that have a current drive capability that varies according to the output load.

FIG. 1 is a block diagram showing a conventional output driver control scheme that may be used, for example, in a Rambus DRAM. Referring to FIG. 1, a reference voltage regulator 13 generates a reference voltage and provides the reference voltage Vgate to a reference voltage distributor 12. The reference voltage distributor 12 selectively activates output signals, referred to as gate enable signals Envg<6:0> to have the level of the reference voltage Vgate, in response to current drive capability control signals Ictl<6:0> during activation of an output enable signal Vgen. The current drive capability of an output driver 11 varies in response to the selective activation of the gate enable signals Envg<6:0>. The output driver 11 receives output signals q and q1 and provides them to an output pad 15. The current drive capability control signals Ictl<6:0> are generated by a current control circuit 14 that senses the load of the output pad 15 and controls the current drive capability of the output driver 11.

However, since the gate enable signals Envg<6:0> may be applied to large numbers of output drivers in common, the lines used for transmitting the gate enable signals Envg<6:0> may be very long so that the loads of the lines may be large. Accordingly, when activating the lines used for transmitting the gate enable signals Envg<6:0> to the level of the reference voltage Vgate, a great deal of charge may be consumed, which may result in a drop of the output voltage of the reference voltage regulator 13, referred to as the reference voltage Vgate. Consequently, it may take excessive time to stabilize the lines for transmitting the gate enable signals Envg<6:0> at the level of the reference voltage Vgate. This may cause the output operation of the Rambus DRAM or other integrated circuit to slow down and/or may cause the device to malfunction.

The current output capability of the reference voltage regulator 13 may be made very large to recover the drop of the reference voltage Vgate within a short time. Unfortunately, a high current reference voltage regulator 13 may consume excessive power, which can result in an increase of the power consumption of the integrated circuit.

SUMMARY OF THE INVENTION

Embodiments of the present invention provide reference voltage regulators and methods for integrated circuit output driver systems, by generating an initial supplementary current for the integrated circuit output driver system at the reference voltage for a predetermined time period in response to an output enable signal. Preferably, sufficient initial supplementary current is generated to compensate for an initial drop in the reference voltage that is generated by a reference voltage generator upon initial activation of the output driver system.

More specifically, reference voltage generators according to embodiments of the invention may be included in an integrated circuit output driver system that is responsive to a reference voltage and to an output enable signal, and that varies in current drive capability in response to a current drive control signal These embodiments of reference voltage regulators include a reference voltage generator that generates the reference voltage for the integrated circuit output driver system. A supplementary current generator generates an initial supplementary current for the integrated circuit output driver system at the reference voltage for a predetermined time period in response to the output enable signal In some embodiments, the supplementary current generator generates a fixed initial supplementary current for the integrated circuit output driver system. In other embodiments, the supplementary current generator generates a variable initial supplementary current for the integrated circuit output driver system at the reference voltage for the predetermined time period in response to the output enable signal, and that varies in response to the current drive control signal.

Embodiments of reference voltage regulators according to the present invention may be used with integrated circuits that include an output driver which varies in current drive capability in response to the selective activation of a plurality of gate enable signals. The integrated circuits also include a reference voltage distributor that receives a reference voltage and selectively activates the gate enable signals to provide a reference voltage in response to a plurality of current drive capability control signals during activation of an output enable signal. The integrated circuits also include a current control circuit that senses a load on the output driver and generates the current drive capability control signals. The reference voltage regulators include a reference voltage generator that generates the reference voltage and provides the reference voltage to the reference voltage distributor. The reference voltage regulators also include a reference voltage compensator that provides the current to an output terminal of the reference voltage generator for a predetermined period of time, to compensate for a drop in the reference voltage in response to the output enable signal.

In some embodiments, the reference voltage compensator is further controlled by the current drive capability control signals, to vary the current supply to the output terminal of the reference voltage generator.

In other embodiments, the reference voltage compensator includes an automatic pulse generator that generates a pulse signal in response to the activation of the output signal for the predetermined period of time, and a current supply circuit that supplies the current to the output terminal of the reference voltage generator in response to the pulse signal of the automatic pulse generator. In yet other embodiments, a plurality of automatic pulse generators may be provided, each of which generates a pulse signal in response to the activation of the output enable signal for the predetermined period of time, while a corresponding one of the current drive capability control signals is activated. A plurality of current supply circuits also may be provided, each of which supplies current to the output terminal of the reference voltage generator, in response to the output signal of the corresponding automatic pulse generator.

Reference voltage regulators and methods according to embodiments of the present invention can at least partially compensate for the drop in the reference voltage within a short time, without the need to increase the current capacity of the reference voltage generator. Accordingly, for example, in Rambus DRAM devices according to embodiments of the present invention, the gate enable signals can be stabilized rapidly at the level of the reference voltage. High speed operation may be maintained, and malfunctions may not be induced.

DETAILED DESCRIPTION OF PREFERRED EMBODIMENTS

Figure 1:
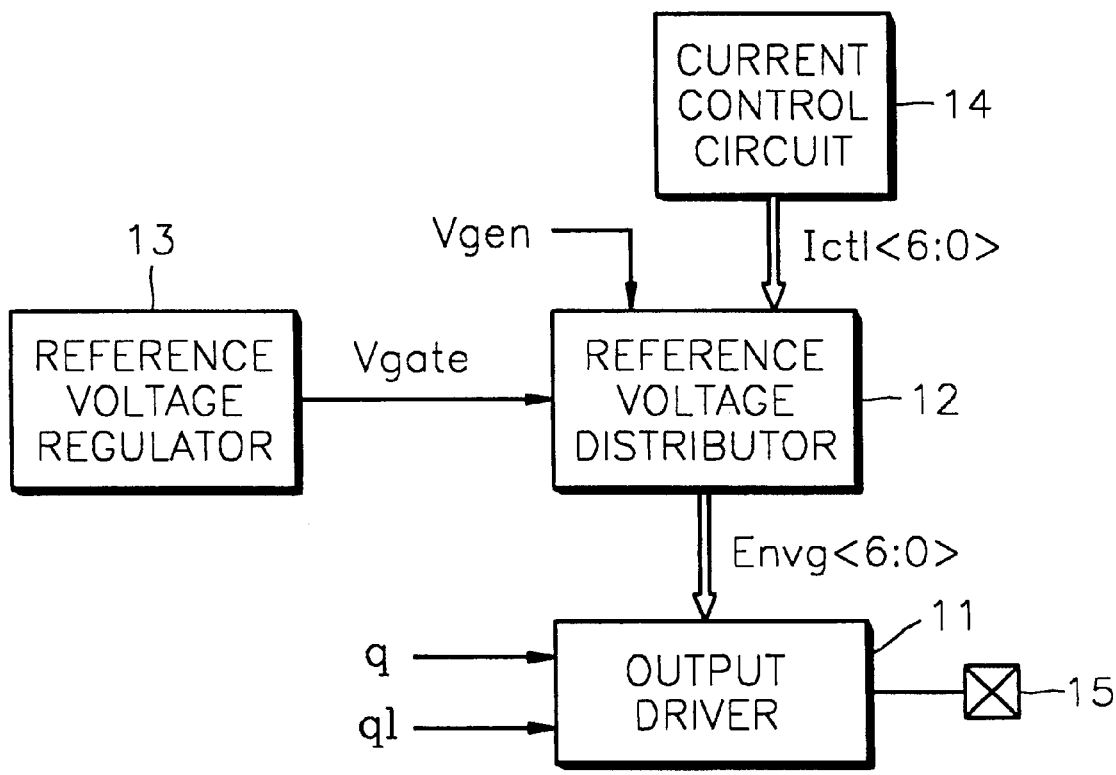
FIG. 1 is a block diagram showing a conventional output driver control scheme in a Rambus Dynamic Random Access Memory (DRAM).

The present invention now will be described more fully hereinafter with reference to the accompanying drawings, in which preferred embodiments of the invention are shown. This invention may, however, be embodied in many different forms and should not be construed as limited to the embodiments set forth herein;

rather, these embodiments are provided so that this disclosure will be thorough and complete, and will fully convey the scope of the invention to those skilled in the art.

In the drawings, the thickness of layers and regions are exaggerated for clarity. Like numbers refer to like elements throughout. Moreover, each embodiment described and illustrated herein includes its complementary conductivity type embodiment as well.

Figure 2A:
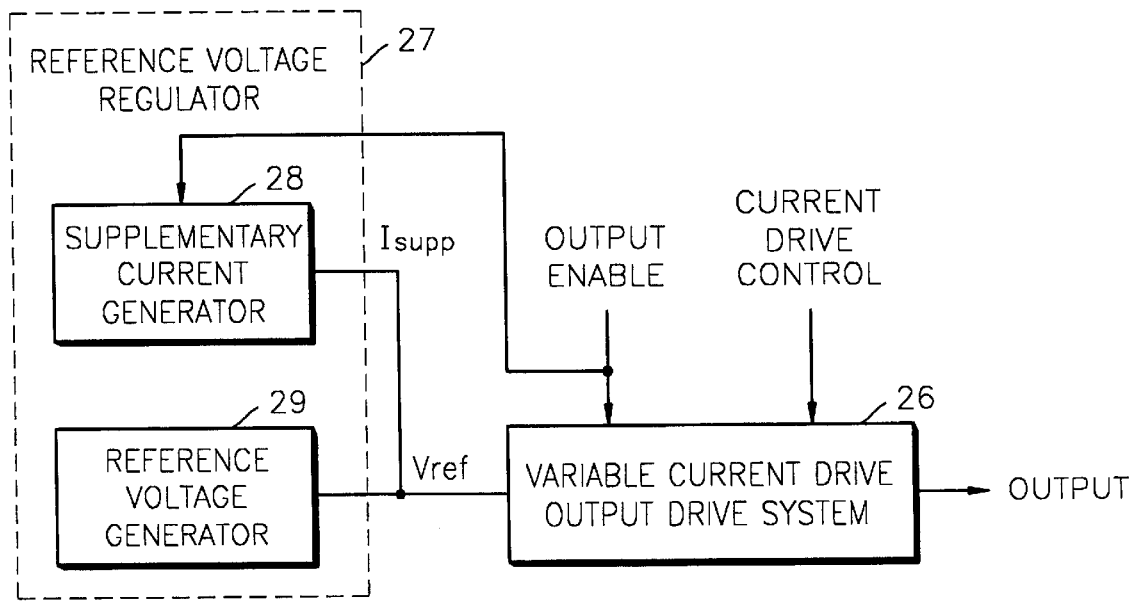
FIG. 2A is a block diagram of reference voltage regulators and methods for integrated circuit output driver systems, according to embodiments of the present invention.

Referring to FIG. 2A, a block diagram of reference voltage regulators and methods for integrated circuit output driver systems according to embodiments of the invention is shown. These embodiments of reference voltage regulators and methods may be used in Rambus DRAM devices, other memory devices, and/or other integrated circuit devices. As shown in FIG. 2A, an integrated circuit includes a variable current driver output drive system 26 that is responsive to a reference voltage Vref and to an output enable signal, and that varies in current drive capability at an output thereof, in response to a current drive control signal. A reference voltage regulator 27 includes a reference voltage generator 29 that generates the reference voltage for the output driver system 26. A supplementary current generator 28 also is provided, that generates an initial supplementary current Isupp for the output driver system 26 at the reference voltage Vref for a predetermined time period, in response to the output enable signal.

Figure 2B:
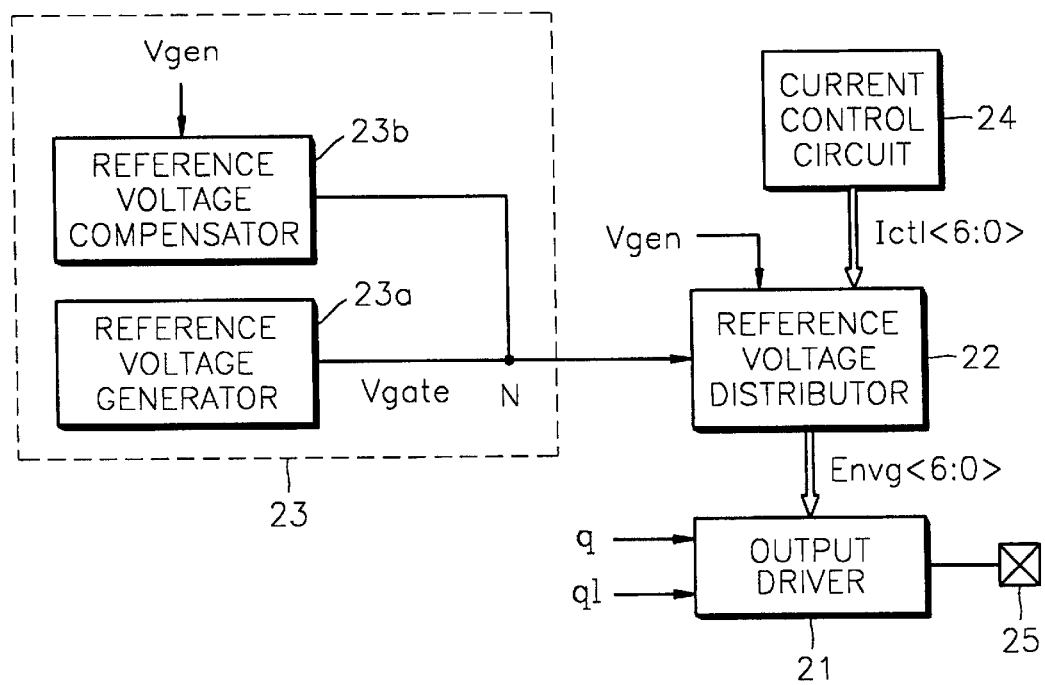
FIG. 2B is a block diagram of reference voltage regulators and methods for integrated circuit output driver systems, according to other embodiments of the present invention.

Referring now to FIG. 2B, a block diagram of other embodiments of reference voltage regulators and methods for integrated circuit output driver systems according to embodiments of the invention is shown. As shown in FIG. 2B, an integrated circuit output driver system may include a current control circuit 24, a reference voltage distributor 22 and an output driver 21. The reference voltage regulator 23 may include a reference voltage generator 23a and a reference voltage compensator 23b.

The output driver 21 varies in current drive capability in response to selective activation of a plurality of gate enable signals Envg<6:0> and receives and provides output signals q and q1 to an output terminal 25, such as an output pad. The output signals q and q1 may be obtained by multiplexing data read from a memory cell array in an output multiplexer. There may be a predetermined delay difference between the output signals q and q1. In other integrated circuit devices, the output signals may be obtained using other techniques, depending upon the particular function of the integrated circuit device.

The reference voltage distributor 22 receives a reference voltage, referred to as Vgate, and selectively activates the gate enable signals Envg<6:0> to the level of the reference voltage Vgate in response to a plurality of current drive capability control signals Ictl<6:0> during activation of an output enable signal, referred to here as Vgen. The current control circuit 24 senses a load of the output terminal 25 and generates the current drive control signals, referred to herein as current drive capability control signals Ictl<6:0> for controlling the current drive capability of the output driver 21.

The reference voltage regulator 23 includes a reference voltage generator 23a and a reference voltage compensator 23b. The reference voltage generator 23a generates and provides the constant reference voltage Vgate that preferably is independent of the fabrication process, power supply voltage and/or temperature, to the reference voltage distributor 22. The reference voltage Vgate can be selected to allow the output driver 21 to always operate in a saturated region. In some embodiments it may be about 1.4V.

In an integrated circuit such as a Rambus DRAM described above, since the gate enable signals Envg<6:0> are applied to a plurality of output drivers in common, the lines used for transmitting the gate enable signals Envg<6:0> may be very long. Moreover, as shown in FIG. 3, coupling capacitors C0 through C6 for adjusting the amount of coupling of first NMOS transistors N1, N3, ..., and N21 of pull-down circuits 31 through 41, may be coupled to the lines used for transmitting the gate enable signals Envg<6:0> to stabilize the gate enable signals Envg<6:0>.

Accordingly, the loads of the lines for transmitting the gate enable signals Envg<6:0> may be very great so that a great deal of charge may be consumed when activating the lines for transmitting the gate enable signals Envg<6:0> to attain the level of the reference voltage Vgate. As a result, the reference voltage Vgate may drop and it may take much time to stabilize the lines for transmitting the gate enable signals Envg<6:0> at the level of the reference voltage Vgate. Embodiments of the present invention may include the reference voltage generator 23a for generating the reference voltage Vgate and the reference voltage compensator 23b for supplying current to an output terminal N of the reference voltage generator 23a for a predetermined period of time in response to the output enable signal Vgen, to compensate for the drop of the reference voltage Vgate.

Figure 3:
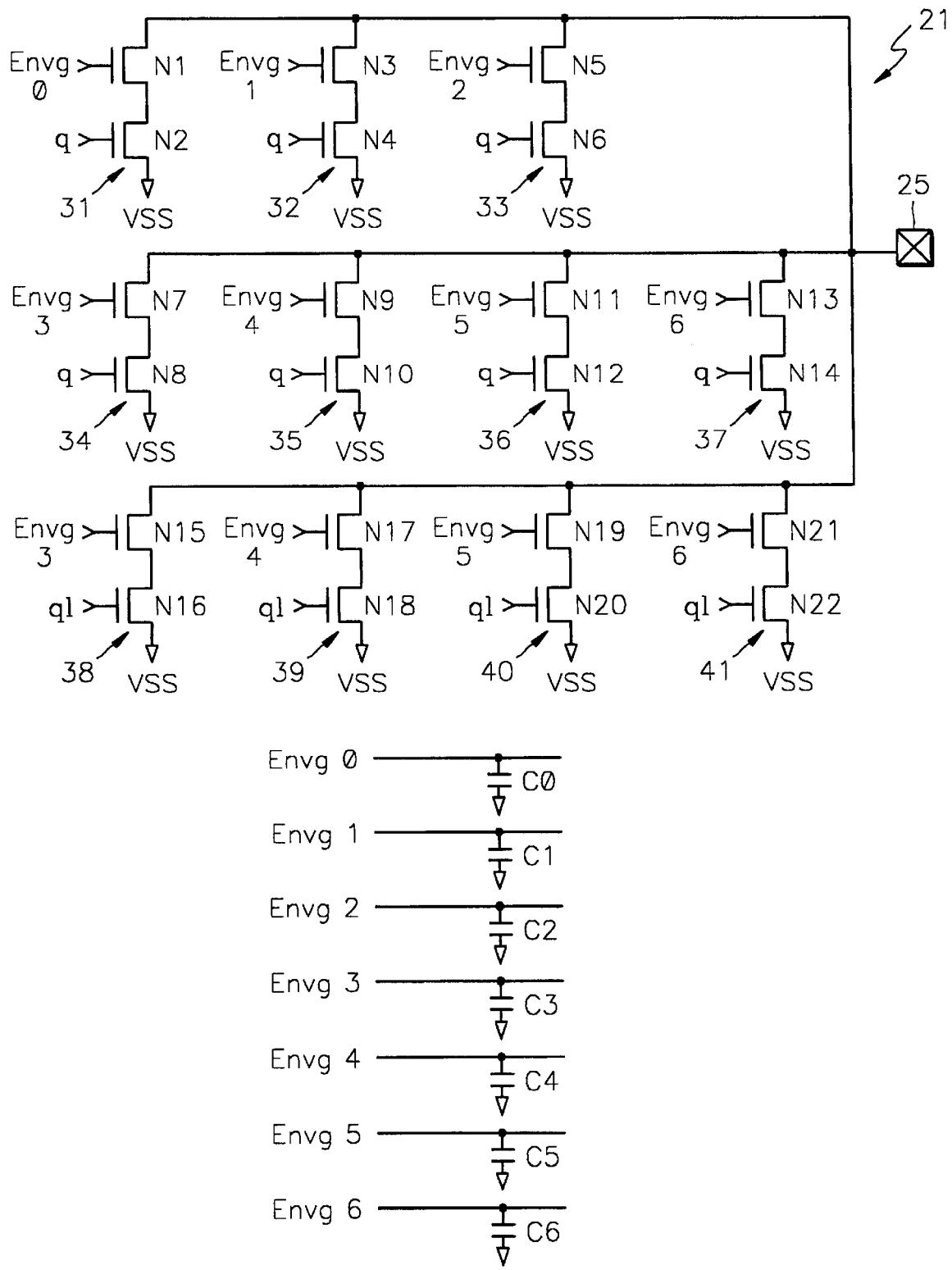
FIG. 3 is a circuit diagram of an output driver depicted in FIG. 2B, according to embodiments of the present invention.

FIG. 3 is a circuit diagram of embodiments of the output driver 21 depicted in FIG. 2B. Referring to FIG. 3, the output driver 21 includes a plurality of pull-down circuits 31 through 41 coupled in parallel between the output terminal 25 and a ground voltage VSS. The pull-down circuits 31 through 41 each include two NMOS transistors, namely, a first NMOS transistor N1, N3, ..., or N21 and a second NMOS transistor N2, N4, ..., or N22 coupled in series between the output terminal 25 and the ground voltage VSS. In one embodiment, the pull-down circuits 31 through 41 are designed to have different current drive capability. One of the gate enable signals Envg<6:0> is applied to the gate of a first NMOS transistor and one of the output signals q and q1 is applied to the gate of a second NMOS transistor. In addition, the coupling capacitors C0 through C6 are coupled to the lines for transmitting the gate enable signals Envg<6:0> to stabilize the gate enable signals Envg<6:0> by adjusting the amount of coupling of the first NMOS transistors N1, N3, ..., and N21 of the pull-down circuits 31 through 41. Accordingly, the pull-down circuits 31 through 41 are selectively operated in response of the selective activation of the gate enable signals Envg<6:0> in the output driver 21. In other words, the current drive capability of the output driver 21 can vary depending on the selective activation of the gate enable signals Envg<6:0>.

Figure 4:
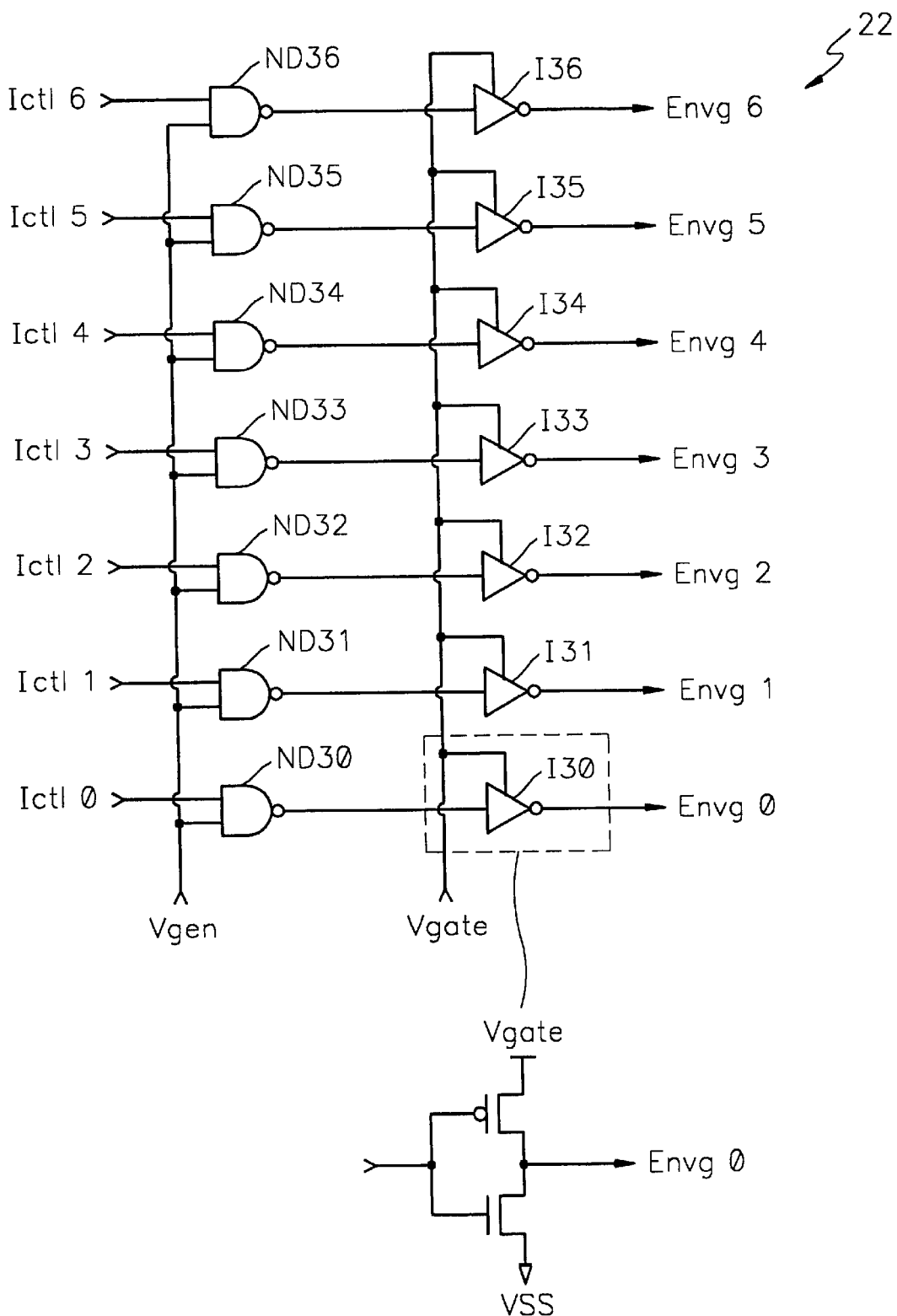
FIG. 4 is a circuit diagram of a reference voltage distributor depicted in FIG. 2B, according to embodiments of the present invention.

FIG. 4 is a circuit diagram of embodiments of a reference voltage distributor 22 depicted in FIG. 2B. Referring to FIG. 4, the reference voltage distributor 22 includes a plurality of NAND gates ND30 through ND36 and a plurality of inverters I30 through I36 which use the reference voltage Vgate as a power supply voltage. Each of the NAND gates ND30 through ND36 receives a corresponding one of the current drive capability control signals Ictl<6:0> and the output enable signal Vgen and performs a NAND operation. Each of the inverters I30 through I36 activates a corresponding one of the gate enable signals Envg<6:0> to have the level of the reference voltage when an output of the corresponding NAND gate is logic low.

For example, when only the current drive capability control signal Ictl 3 is logic high and the other current drive capability control signals are all logic low while the output enable signal Vgen is activated to be logic high, only the output of the NAND gate ND33 becomes logic low. Accordingly, only the output of the inverter I33, the gate enable signal Envg 3, is activated to have the level of the reference voltage Vgate while the other gate enable signals remain in the logic low state. Therefore, only the pull-down circuits 34 and 38 of the pull-down circuits 31 through 41 shown in FIG. 3 may operate.

Figure 5:
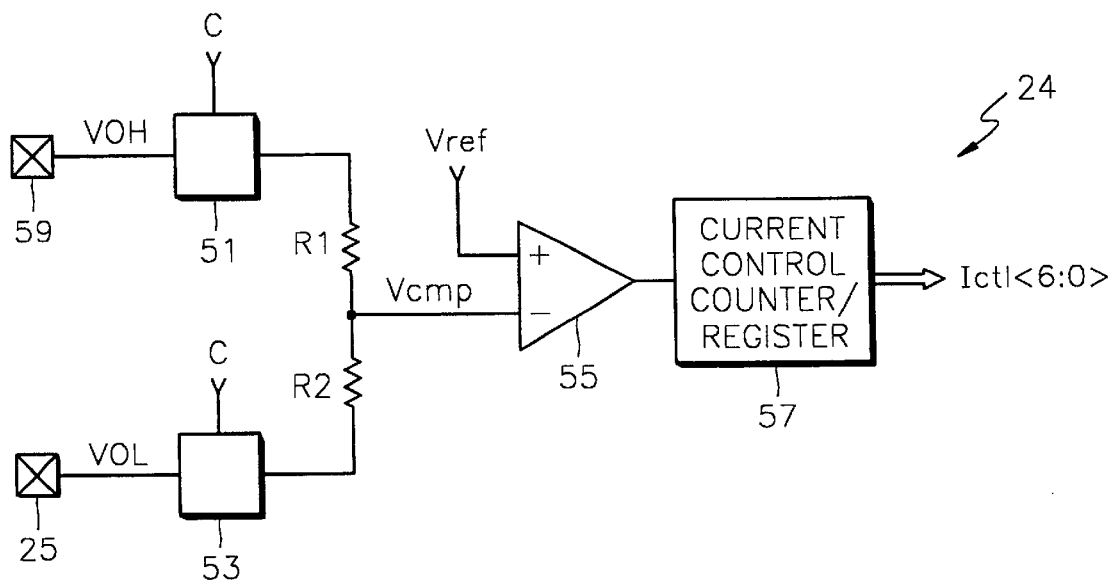
FIG. 5 is a circuit diagram of a current control circuit depicted in FIG. 2B, according to embodiments of the present invention.

FIG. 5 is a circuit diagram of embodiments of a current control circuit 24 depicted in FIG. 2B. Referring to FIG. 5, the current control circuit 24 includes a first transmitter 51 and a second transmitter 53, a voltage divider including resistors R1 and R2, a comparator 55 and a current control counter/register 57. The first transmitter 51 transmits a voltage VOH of a first pad 59 in response to a predetermined control signal C. The second transmitter 53 transmits a voltage VOL of a second pad 25 in response to the predetermined control signal C. The second pad 25 corresponds to the output terminal 25 shown in FIGS. 2 and 3. The voltage divider including the resistors R1 and R2 divides a voltage between the outputs of the first and second transmitters 51 and 53 to provide a divided voltage Vcmp. The comparator 55 compares the divided voltage Vcmp with a reference voltage Vref. The current control counter/register 57 generates the current drive capability control signals Ictl<6:0> for controlling the current drive capability of the output driver 21 in response to the output of the comparator 55.

Figure 6:
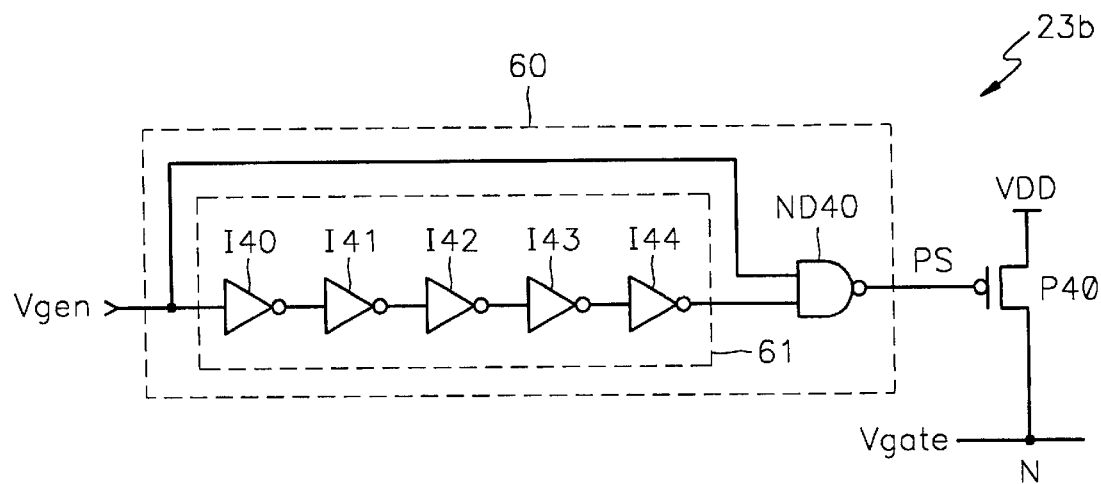
FIG. 6 is a circuit diagram of a first embodiment of a reference voltage compensator depicted in FIG. 2B, according to embodiments of the present invention.

FIG. 6 is a circuit diagram showing first embodiments of a reference voltage compensator 23b depicted in FIG. 2B. Referring to FIG. 6, a reference voltage compensator according to the first embodiments includes an automatic pulse generator 60 and a current supply unit P40.

The automatic pulse generator 60 generates a pulse signal PS of a logic low level for a predetermined period of time in response to the activation of the output enable signal Vgen. The current supply unit P40 supplies the current to the output terminal N of the reference voltage generator 23a shown in FIG. 2B in response to the output signal PS of the automatic pulse generator 60. The automatic pulse generator 60 includes an inverting delay unit 61 for delaying and inverting the output enable signal Vgen and an inverting AND operation unit ND40 for performing an AND operation with respect to the output enable signal Vgen and an output signal of the inverting delay unit 61, and inverting a result of the AND operation to generate the pulse signal PS of a logic low level. Here, the inverting delay unit 61 includes inverters I40 through I44 coupled in series. The number of invertors preferably is an odd number. The inverting AND operation unit ND40 is realized as a NAND gate.

In embodiments of FIG. 6, the current supply unit P40 is a PMOS transistor in which the power supply voltage VDD is applied to the source, the output signal of the automatic pulse generator 60, that is, the pulse signal PS, is applied to the gate, and the drain is coupled to the output terminal N of the reference voltage generator 23a. The power supply voltage VDD may be an external power supply voltage applied from outside of the integrated circuit such as a Ram bus DRAM, an internal power supply voltage internally generated from the received external power supply voltage, a boosted voltage higher than the external power supply voltage and/or another power supply voltage. Accordingly, the reference voltage compensator according to the first embodiment supplies constant current to the output terminal N of the reference voltage generator 23a via the current supply unit P40 during the pulse duration of the pulse signal PS which is generated when the output enable signal Vgen is activated to be logic high.

Figure 7:
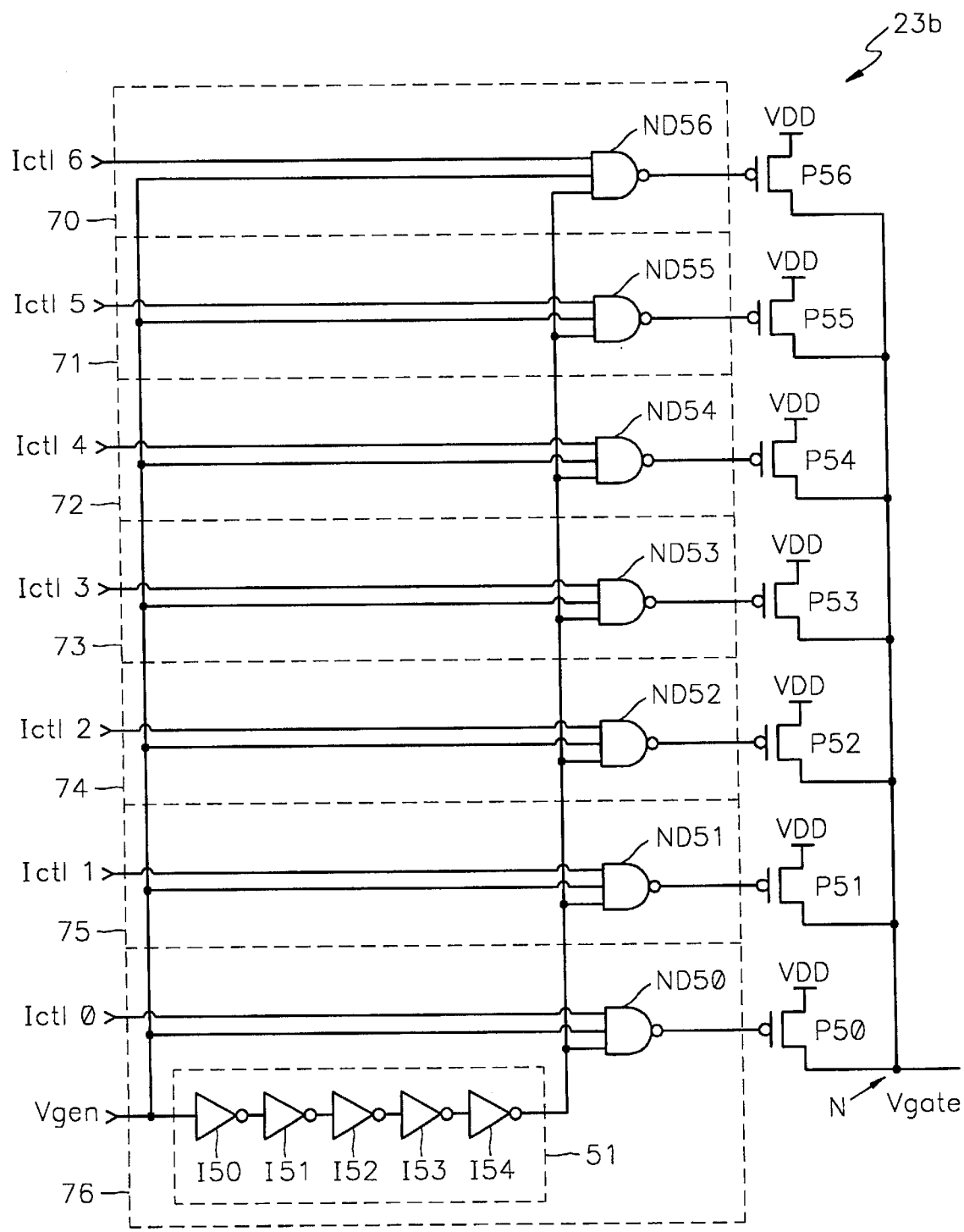
FIG. 7 is a circuit diagram of second embodiments of a reference voltage compensator depicted in FIG. 2B, according to embodiments of the present invention.

FIG. 7 is a circuit diagram showing second embodiments of a reference voltage compensator 23b depicted in FIG. 2B. Referring to FIG. 7, reference voltage compensators according to the second embodiments include a plurality of automatic pulse generators 70 through 76 and a plurality of current supply units P50 through P56.

Each of the automatic pulse generators 70 through 76 generates a pulse signal of a logic low level for a predetermined period of time in response to the activation of the output enable signal Vgen while a corresponding one of the current drive capability control signals Ictl<6:0> is activated. Each of the current supply units P50 through P56 supplies current to the output terminal N of the reference voltage generator 23a shown in FIG. 2B in response to the output signal of a corresponding automatic pulse generator. The automatic pulse generators 70 through 76 each is connected to an inverting delay unit 51 for delaying and inverting the output enable signal Vgen and includes one of the inverting AND operation units ND50 through ND56 for performing an AND operation with respect to a corresponding one of the current drive capability control signals Ictl<6:0>, the output enable signal Vgen and an output signal of the inverting delay unit 51, and inverting a result of the AND operation to generate the pulse signal. As shown in FIG. 7, a single inverting delay unit 51 may be used for the automatic pulse generators 70 through 76 in common. Here, the inverting delay unit 51 includes invertors I50 through I54 coupled in series. The number of invertors preferably is an odd number. The inverting AND operation units ND50 through ND56 are respectively realized as NAND gates.

Each of the current supply units P50 through P56 is realized as a PMOS transistor in which the power supply voltage VDD is applied to the source, the output signal of a corresponding automatic pulse generator is applied to the gate, and the drain is coupled to the output terminal N of the reference voltage generator 23a. The current supply units P50 through P56 may be designed to have less current supply performance than the current supply unit P40 of the first embodiment. The power supply voltage VDD may be an external power supply voltage applied from the outside of the integrated circuit such as a Rambus DRAM, an internal power supply voltage internally generated from the received external power supply voltage, a boosted voltage higher than the external power supply voltage and/or other power supply voltages.

Accordingly, in reference voltage compensators according to the second embodiments, only the automatic pulse generator and the current supply unit may be operated that corresponds to one current drive capability control signal from the current drive capability control signals Ictl<6:0> which is activated to be logic high. For example, when the current drive capability control signal Ictl 3 among the current drive capability control signals Ictl<6:0> is logic high, as shown in FIG. 4, only the gate enable signal Envg 3 is activated to have the level of the reference voltage Vgate. Accordingly, only the automatic pulse generator 73 is operated. Therefore, the current supply unit P53 supplies the current to the output terminal N of the reference voltage generator 23a in response to the output signal of the automatic pulse generator 73, thereby allowing unnecessary current consumption to be reduced. Consequently, in reference voltage compensators, according to the second embodiments, only the necessary amount of the current may be supplied to the output terminal N of the reference voltage generator 23a based on the current drive capability control signals Ictl<6:0>, thereby allowing the current consumption to be reduced.

As described above, reference voltage regulators and methods according to embodiments of the present invention can compensate at least in part, for an initial drop in the reference voltage Vgate, without the need to increase the capacity of the reference voltage generator 23a. For example, in a Rambus DRAM according to embodiments of the present invention, the reference voltage compensator 23b can compensate for an initial drop in the reference voltage Vgate so that the gate enable signals Envg<6:0> can rapidly stabilize at the level of the reference voltage Vgate. High speed operation and/or reduced errors may be obtained.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A reference voltage regulator for an integrated circuit that includes an output driver which varies in current drive capability in response to selective activation of a plurality of gate enable signals, a reference voltage distributor that receives a reference voltage and selectively activates the gate enable signals to provide a reference voltage in response to a plurality of current drive capability control signals during activation of an output enable signal, and a current control circuit that senses a load on the output driver and generates the current drive capability control signals, the reference voltage regulator comprising:

a reference voltage generator that generates the reference voltage and provides the reference voltage to the reference voltage distributor; and a reference voltage compensator that provides current to an output terminal of the reference voltage generator for a predetermined period of time that corresponds to a delay characteristic of circuitry of the reference voltage compensator to compensate for a drop in the reference voltage in response to the output enable signal.

2. The reference voltage regulator of claim 1, wherein the reference voltage compensator is further controlled by the current drive capability control signals to vary the current supplied to the output terminal of the reference voltage generator.

3. The reference voltage regulator of claim 1, wherein the reference voltage compensator comprises:

an automatic pulse generator that generates a pulse signal in response to the activation of the output enable signal for the predetermined period of time; and a current supply circuit that supplies the current to the output terminal of the reference voltage generator in response to the pulse signal of the automatic pulse generator.

4. The reference voltage regulator of claim 3, wherein the automatic pulse generator comprises:

an inverting delay unit that delays and inverts the output enable signal; and an inverting AND circuit that performs an AND operation with respect to the output enable signal and an output signal of the inverting delay unit and inverts a result of the AND operation to generate the pulse signal.

5. The reference voltage regulator of claim 3, wherein the current supply circuit comprises a PMOS transistor in which a power supply voltage is applied to the source, the output signal of the automatic pulse generator is applied to the gate and the drain is coupled to the output terminal of the reference voltage generator.

6. The reference voltage regulator of claim 1, wherein the reference voltage compensator comprises:

a plurality of automatic pulse generators, each of which generates a pulse signal in response to the activation of the output enable signal for the predetermined period of time while a corresponding one of the current drive capability control signals is activated; and a plurality of current supply circuits each of which supplies current to the output terminal of the reference voltage generator in response to the output signal of a corresponding automatic pulse generator.

7. The reference voltage regulator of claim 6, wherein each automatic pulse generator comprises:

an inverting delay unit that delays and inverts the output enable signal; and an inverting AND circuit that performs an AND operation with respect to the corresponding current drive capability control signal, the output enable signal and an output signal of the inverting delay unit and inverts a result of the AND operation to generate the pulse signal.

8. The reference voltage regulator of claim 6, wherein the current supply circuit comprises a PMOS transistor in which a power supply voltage is applied to the source, the output signal of the corresponding automatic pulse generator is applied to the gate and the drain is coupled to the output terminal of the reference voltage generator.

9. An integrated circuit device comprising:

an output driver which varies in current drive capability in response to selective activation of a plurality of gate enable signals;

a reference voltage distributor that receives a reference voltage and selectively activates the gate enable signals to provide a reference voltage in response to a plurality of current drive capability control signals during activation of an output enable signal;

a current control circuit that senses a load on the output driver and generates the current drive capability control signals;

a reference voltage generator that generates the reference voltage and provides the reference voltage to the reference voltage distributor; and a reference voltage compensator that provides current to an output terminal of the reference voltage generator for a predetermined period of time that corresponds to a delay characteristic of circuitry of the reference voltage compensator to compensate for a drop in the reference voltage in response to the output enable signal.

10. The integrated circuit device of claim 9, wherein the reference voltage compensator is further controlled by the current drive capability control signals to vary the current supplied to the output terminal of the reference voltage generator.

11. The integrated circuit device of claim 9, wherein the reference voltage compensator comprises:

an automatic pulse generator that generates a pulse signal in response to the activation of the output enable signal for the predetermined period of time; and a current supply circuit that supplies the current to the output terminal of the reference voltage generator in response to the pulse signal of the automatic pulse generator.

12. The integrated circuit device of claim 11, wherein the automatic pulse generator comprises:

an inverting delay unit that delays and inverts the output enable signal; and an inverting AND circuit that performs an AND operation with respect to the output enable signal and an output signal of the inverting delay unit and inverts a result of the AND operation to generate the pulse signal.

13. The integrated circuit device of claim 11, wherein the current supply circuit comprises a PMOS transistor in which a power supply voltage is applied to the source, the output signal of the automatic pulse generator is applied to the gate and the drain is coupled to the output terminal of the reference voltage generator.

14. The integrated circuit device of claim 9, wherein the reference voltage compensator comprises:

a plurality of automatic pulse generators, each of which generates a pulse signal in response to the activation of the output enable signal for the predetermined period of time while a corresponding one of the current drive capability control signals is activated; and a plurality of current supply circuits each of which supplies current to the output terminal of the reference voltage generator in response to the output signal of a corresponding automatic pulse generator.

15. The integrated circuit device of claim 14, wherein each automatic pulse generator comprises:

an inverting delay unit that delays and inverts the output enable signal; and an inverting AND circuit that performs an AND operation with respect to the corresponding current drive capability control signal, the output enable signal and an output signal of the inverting delay unit and inverts a result of the AND operation to generate the pulse signal.

16. The integrated circuit device of claim 14, wherein the current supply circuit comprises a PMOS transistor in which a power supply voltage is applied to the source, the output signal of the corresponding automatic pulse generator is applied to the gate and the drain is coupled to the output terminal of the reference voltage generator.

17. A reference voltage regulator for an integrated circuit output driver system that is responsive to a reference voltage and to an output enable signal and that varies in current drive capability in response to a current drive control signal, the reference voltage regulator comprising:

a reference voltage generator that generates the reference voltage for the integrated circuit output driver system; and a supplementary current generator that generates an initial supplementary current for the integrated circuit output driver system at the reference voltage for a predetermined time period that corresponds to a delay characteristic of circuitry of the supplementary current generator in response to the output enable signal.

18. A reference voltage regulator according to claim 17 wherein the supplementary current generator generates a fixed initial supplementary current for the integrated circuit output driver system at the reference voltage for the predetermined time period in response to the output enable signal.

19. A reference voltage regulator according to claim 17 wherein the supplementary current generator generates a variable initial supplementary current for the integrated circuit output driver system at the reference voltage for the predetermined time period in response to the output enable signal, wherein the supplementary current varies in response to the current drive control signal.

20. A reference voltage regulator according to claim 17 wherein the supplementary current generator generates sufficient initial supplementary current for the integrated circuit output driver system to compensate for an initial drop in the reference voltage that is generated by the reference voltage generator upon initial activation of the output driver system.

21. An integrated circuit comprising:
  an integrated circuit output driver system that is responsive to a reference voltage and to an output enable signal and that varies in current drive capability in response to a current drive control signal;
  a reference voltage generator that generates the reference voltage for the integrated circuit output driver system; and
  a supplementary current generator that generates an initial supplementary current for the integrated circuit output driver system at the reference voltage for a predetermined time period that corresponds to a delay characteristic of circuitry of the supplemental current generator in response to the output enable signal.

22. An integrated circuit according to claim 21 wherein the supplementary current generator generates a fixed initial supplementary current for the integrated circuit output driver system at the reference voltage for the predetermined time period in response to the output enable signal.

23. An integrated circuit according to claim 21 wherein the supplementary current generator generates a variable initial supplementary current for the integrated circuit output driver system at the reference voltage for the predetermined time period in response to the output enable signal and that varies in response to the current drive control signal.

24. An integrated circuit according to claim 21 wherein the supplementary current generator generates sufficient initial supplementary current for the integrated circuit output driver system to compensate for an initial drop in the reference voltage that is generated by the reference voltage generator upon initial activation of the output driver system.

25. A method of providing a reference voltage for an integrated circuit output driver system that is responsive to the reference voltage and to an output enable signal and that varies in current drive capability in response to a current drive control signal, the method comprising:
  generating the reference voltage for the integrated circuit output driver system; and
  generating an initial supplementary current for the integrated circuit output driver system at the reference voltage for a predetermined time period that corresponds to a circuit delay characteristic in response to the output enable signal.

26. A method according to claim 25 wherein the step of generating an initial supplementary current comprises generating a fixed initial supplementary current for the integrated circuit output driver system at the reference voltage for the predetermined time period in response to the output enable signal.

27. A method according to claim 25 wherein the step of generating an initial supplementary current comprises generating a variable initial supplementary current for the integrated circuit output driver system at the reference voltage for the predetermined time period in response to the output enable signal, wherein the supplementary current varies in response to the current drive control signal.

28. A method according to claim 25 wherein the step of generating an initial supplementary current comprises generating sufficient initial supplementary current for the integrated circuit output driver system to compensate for an initial drop in the reference voltage that is generated by the reference voltage generating step upon initial activation of the output driver system.

29. A reference voltage regulator for an integrated circuit that includes an output driver which varies in current drive capability in response to selective activation of a plurality of gate enable signals, a reference voltage distributor that receives a reference voltage and selectively activates the gate enable signals to provide a reference voltage in response to a plurality of current drive capability control signals during activation of an output enable signal, and a current control circuit that senses a load on the output driver and generates the current drive capability control signals, the reference voltage regulator comprising:
  a reference voltage generator that generates the reference voltage and provides the reference voltage to the reference voltage distributor; and
  a reference voltage compensator that provides current to an output terminal of the reference voltage generator for a predetermined period of time to compensate for a drop in the reference voltage in response to the output enable signal, wherein the reference voltage compensator comprises:
    an automatic pulse generator that generates a pulse signal in response to the activation of the output enable signal for the predetermined period of time; and
    a current supply circuit that supplies the current to the output terminal of the reference voltage generator in response to the pulse signal of the automatic pulse generator.

30. The reference voltage regulator of claim 29, wherein the automatic pulse generator comprises:
  an inverting delay unit that delays and inverts the output enable signal; and
  an inverting AND circuit that performs an AND operation with respect to the output enable signal and an output signal of the inverting delay unit and inverts a result of the AND operation to generate the pulse signal.

31. The reference voltage regulator of claim 29, wherein the current supply circuit comprises a PMOS transistor in which a power supply voltage is applied to the source, the output signal of the automatic pulse generator is applied to the gate and the drain is coupled to the output terminal of the reference voltage generator.

32. A reference voltage regulator for an integrated circuit that includes an output driver which varies in current drive capability in response to selective activation of a plurality of gate enable signals, a reference voltage distributor that receives a reference voltage and selectively activates the gate enable signals to provide a reference voltage in response to a plurality of current drive capability control signals during activation of an output enable signal, and a current control circuit that senses a load on the output driver and generates the current drive capability control signals, the reference voltage regulator comprising:

a reference voltage generator that generates the reference voltage and provides the reference voltage to the reference voltage distributor; and a reference voltage compensator that provides current to an output terminal of the reference voltage generator for a predetermined period of time to compensate for a drop in the reference voltage in response to the output enable signal, wherein the reference voltage compensator comprises:

a plurality of automatic pulse generators, each of which generates a pulse signal in response to the activation of the output enable signal for the predetermined period of time while a corresponding one of the current drive capability control signals is activated; and a plurality of current supply circuits each of which supplies current to the output terminal of the reference voltage generator in response to the output signal of a corresponding automatic pulse generator.

33. The reference voltage regulator of claim 32, wherein each automatic pulse generator comprises:

an inverting delay unit that delays and inverts the output enable signal; and an inverting AND circuit that performs an AND operation with respect to the corresponding current drive capability control signal, the output enable signal and an output signal of the inverting delay unit and inverts a result of the AND operation to generate the pulse signal.

34. The reference voltage regulator of claim 32, wherein the current supply circuit comprises a PMOS transistor in which a power supply voltage is applied to the source, the output signal of the corresponding automatic pulse generator is applied to the gate and the drain is coupled to the output terminal of the reference voltage generator.

35. An integrated circuit device comprising:

an output driver which varies in current drive capability in response to selective activation of a plurality of gate enable signals;

a reference voltage distributor that receives a reference voltage and selectively activates the gate enable signals to provide a reference voltage in response to a plurality of current drive capability control signals during activation of an output enable signal;

a current control circuit that senses a load on the output driver and generates the current drive capability control signals;

a reference voltage generator that generates the reference voltage and provides the reference voltage to the reference voltage distributor; and a reference voltage compensator that provides current to an output terminal of the reference voltage generator for a predetermined period of time to compensate for a drop in the reference voltage in response to the output enable signal, wherein the reference voltage compensator comprises:

an automatic pulse generator that generates a pulse signal in response to the activation of the output enable signal for the predetermined period of time; and a current supply circuit that supplies the current to the output terminal of the reference voltage generator in response to the pulse signal of the automatic pulse generator.

36. The integrated circuit device of claim 35, wherein the automatic pulse generator comprises:

an inverting delay unit that delays and inverts the output enable signal; and an inverting AND circuit that performs an AND operation with respect to the output enable signal and an output signal of the inverting delay unit and inverts a result of the AND operation to generate the pulse signal.

37. The integrated circuit device of claim 35, wherein the current supply circuit comprises a PMOS transistor in which a power supply voltage is applied to the source, the output signal of the automatic pulse generator is applied to the gate and the drain is coupled to the output terminal of the reference voltage generator.

38. An integrated circuit device comprising:

an output driver which varies in current drive capability in response to selective activation of a plurality of gate enable signals;

a reference voltage distributor that receives a reference voltage and selectively activates the gate enable signals to provide a reference voltage in response to a plurality of current drive capability control signals during activation of an output enable signal;

a current control circuit that senses a load on the output driver and generates the current drive capability control signals;

a reference voltage generator that generates the reference voltage and provides the reference voltage to the reference voltage distributor; and a reference voltage compensator that provides current to an output terminal of the reference voltage generator for a predetermined period of time to compensate for a drop in the reference voltage in response to the output enable signal, wherein the reference voltage compensator comprises:

a plurality of automatic pulse generators, each of which generates a pulse signal in response to the activation of the output enable signal for the predetermined period of time while a corresponding one of the current drive capability control signals is activated; and a plurality of current supply circuits each of which supplies current to the output terminal of the reference voltage generator in response to the output signal of a corresponding automatic pulse generator.

39. The integrated circuit device of claim 38, wherein each automatic pulse generator comprises:

an inverting delay unit that delays and inverts the output enable signal; and an inverting AND circuit that performs an AND operation with respect to the corresponding current drive capability control signal, the output enable signal and an output signal of the inverting delay unit and inverts a result of the AND operation to generate the pulse signal.

40. The integrated circuit device of claim 38, wherein the current supply circuit comprises a PMOS transistor in which a power supply voltage is applied to the source, the output signal of the corresponding automatic pulse generator is applied to the gate and the drain is coupled to the output terminal of the reference voltage generator.

* * * * *